United States Patent [19]
Auclair et al.

[11] Patent Number: 6,049,899
[45] Date of Patent: *Apr. 11, 2000

[54] SOFT ERRORS HANDLING IN EEPROM DEVICES

[75] Inventors: Daniel L. Auclair, Mountain View; Jeffrey Craig, Fremont; John S. Mangan, Santa Cruz; Robert D. Norman, San Jose; Daniel C. Guterman, Fremont; Sanjay Mehrotra, Milpitas, all of Calif.

[73] Assignee: Zilog, Inc., Campbell, Calif.

[*] Notice: This patent is subject to a terminal disclaimer.

[21] Appl. No.: 09/113,800

[22] Filed: Jul. 8, 1998

Related U.S. Application Data

[63] Continuation of application No. 08/908,265, Aug. 7, 1997, which is a continuation of application No. 08/406,677, Mar. 20, 1995, Pat. No. 5,657,332, which is a division of application No. 07/886,030, May 20, 1992, abandoned.

[51] Int. Cl.⁷ .................................................. H03M 13/00
[52] U.S. Cl. .......................... 714/721; 714/766; 714/764; 365/184; 365/201; 365/185.03
[58] Field of Search ..................................... 714/763, 721, 714/766, 764; 250/515.1; 327/581; 365/185.22, 201, 104, 207, 184, 185.03, 185.19

[56] References Cited

U.S. PATENT DOCUMENTS

| | | | |
|---|---|---|---|
| 4,139,911 | 2/1979 | Sciulli et al. | 365/207 |
| 4,218,764 | 8/1980 | Furuta et al. | 365/222 |
| 4,253,059 | 2/1981 | Bell et al. | 714/721 |
| 4,460,982 | 7/1984 | Gee et al. | 365/185.19 |
| 4,612,630 | 9/1986 | Rosier | 365/201 |
| 4,703,453 | 10/1978 | Shinoda et al. | 365/104 |
| 4,733,394 | 3/1988 | Giebel | 714/711 |
| 4,763,305 | 8/1988 | Kuo | 365/185.22 |
| 4,779,272 | 10/1988 | Kohda et al. | 714/721 |
| 4,799,195 | 1/1989 | Iwahashi et al. | 365/185.21 |
| 4,809,231 | 2/1989 | Shannon et al. | 365/201 |
| 4,937,787 | 6/1990 | Kobatake | 365/185.22 |
| 4,962,322 | 10/1990 | Chapman | 327/581 |
| 5,122,985 | 6/1992 | Santin | 365/185.19 |
| 5,132,935 | 7/1992 | Ashmore, Jr. | 365/185.19 |
| 5,151,906 | 9/1992 | Sawada | 714/805 |
| 5,157,629 | 10/1992 | Sato et al. | 365/201 |
| 5,172,338 | 12/1992 | Mehrotra et al. | 365/185.03 |
| 5,200,922 | 4/1993 | Rao | 365/185.09 |
| 5,239,505 | 8/1993 | Fazio et al. | 365/185.11 |
| 5,262,984 | 11/1993 | Noguchi et al. | 365/185.03 |
| 5,270,551 | 12/1993 | Kamimura et al. | 250/515.1 |
| 5,278,794 | 1/1994 | Tanaka et al. | 365/185.7 |
| 5,313,427 | 5/1994 | Schreck et al. | 365/218 |
| 5,321,655 | 6/1994 | Iwahashi et al. | 365/185.21 |
| 5,335,198 | 8/1994 | Van Buskirk et al. | 365/185.3 |
| 5,365,486 | 11/1994 | Schreck | 365/185.22 |
| 5,377,147 | 12/1994 | Merchant et al. | 365/185.09 |
| 5,465,236 | 11/1995 | Naruke | 365/185.11 |
| 5,652,720 | 7/1997 | Aulas et al. | 365/185.09 |
| 5,657,332 | 8/1997 | Auclair et al. | 714/763 |

Primary Examiner—Albert De Cady
Assistant Examiner—David Ton
Attorney, Agent, or Firm—Majestic, Parsons, Siebert & Hsue

[57] ABSTRACT

Soft errors occur during normal use of a solid-state memory such as EEPROM or Flash EEPROM. A soft error results from the programmed threshold voltage of a memory cell being drifted from its originally intended level. The error is initially not readily detected during normal read until the cumulative drift becomes so severe that it develops into a hard error. Data could be lost if enough of these hard errors swamps available error correction codes in the memory. A memory device and techniques therefor are capable of detecting these drifts and substantially maintaining the threshold voltage of each memory cell to its intended level throughout the use of the memory device, thereby resisting the development of soft errors into hard errors.

26 Claims, 8 Drawing Sheets

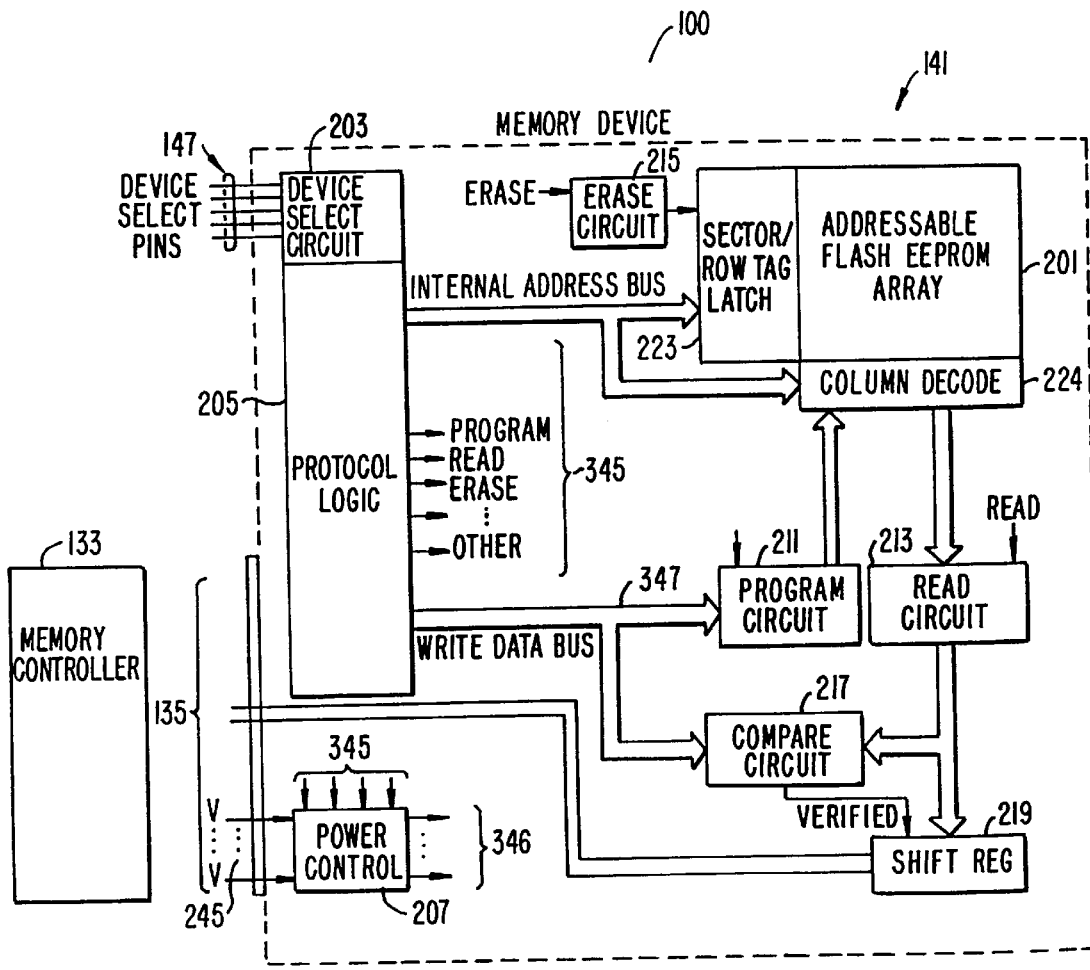

$I_1 > I_2 \Rightarrow 0$
$I_1 < I_2 \Rightarrow 1$

| | |
|---|---|
| $V_N$ | 6.4 |
| $V_{PRH}$ | 5.6 |
| $V_{SH}$ | 5.2 |
| $V_R$ | 5.0 |
| $V_{SL}$ | 4.4 |
| $V_{PRL}$ | 4.2 |
| $V_E$ | 3.8 |

SOFT ERRORS HANDLING IN EEPROM DEVICES

CLAIM FOR PRIORITY

This application is a continuation of application Ser. No. 08/908,265, filed Aug. 7, 1997, now pending, which is a continuation of application Ser. No. 08/406,677, filed Mar. 20, 1995, now U.S. Pat. No. 5,657,332, which is a division of application Ser. No. 07/886,030, filed May 20, 1992, now abandoned.

TECHNICAL FIELD

This invention relates generally to error handling in semiconductor memories. In one specific aspect, this invention relates to improving the reliability of memory devices. In another specific aspect, this invention is related to continual detection and correction of potential data errors in memories such EEPROM or Flash EEPROM.

BACKGROUND OF THE INVENTION

While mass data backup storage in data processing systems has so far relied on magnetic disk drives, the relatively high failure rate of these devices, their fragility, bulkiness and high power consumption (all the results of the devices' heavy dependence upon high precision moving mechanical parts) have led the industry to seek replacements therefor.

One of the heavily pursued candidates is semiconductor memory. While several types of semiconductor memories exist, not all of them can feasibly be used for mass storage of data. For example, random access memory (RAM), being a volatile memory requiring constant supply of electrical power to maintain its memory, is more suitable to be used as temporary working storage and not for mass data backup. And while read only memory (ROM), programmable read only memory (PROM) and ultra-violet programmable read only memory (UVPROM) are non-volatile, the impossibility, or difficulties, in altering their contents have rendered these memories unsuitable for backup mass data storage.

Recently, an interest has been developed in using electrically erasable programmable read only memory (EEPROM) and Flash EEPROM for mass data storage.

EEPROM and Flash EEPROM, and the implementation thereof to serve as mass storage and replace magnetic disk drives, are disclosed in pending U.S. patent application Ser. No. 337,566 of Harari et al., filed Apr. 13, 1989, now abandoned, and U.S. patent application Ser. No. 422,949 of Gross et al., filed Oct. 17, 1989, now U.S. Pat. No. 5,200,959, both of which have the same assignee as the present application.

Essentially, EEPROM or Flash EEPROM are field effect transistors each with an additional polysilicon region generally referred to as the floating gate. Data is "memorized" through confinement of predefined amounts of electric charge in this floating gate.

The electric charge are transferred to the floating gate from the substrate through a dielectric region. They affect the conductivity of the source-drain channel and the threshold voltage of the field effect transistor. Physically, the differences in threshold voltages and the differences in the source-drain currents, due to the confinement of different amounts of electric charge in the floating gates, can then be used to define different logic states (e.g. "0", "1", . . . ). Demarcation threshold voltage levels may be used to demarcate between the different logic states. For example, a "0" or "1" state would respectively have a programmed threshold voltage level less than or greater than the demarcation threshold voltage level between these two states.

Thus each memory cell is capable of supporting a range of threshold voltage levels within a "threshold window" spanned by a maximum and minimum programmable threshold voltage level. Schematically, the threshold window may be partitioned into threshold voltage domains, each representing a memory state. Each domain may be defined by a pair of demarcation threshold voltage levels. In practice, a given memory state is represented by programming a threshold voltage level well within its corresponding domain, preferably located in the middle, with equal margins on either side of the pair of demarcation levels Traditionally, EEPROM and Flash EEPROM are used in applications where semi-permanent storage of data or program is required but with limited reprogramming. But as EEPROM and Flash EEPROM are now intended to replace magnetic disks, a new requirement surfaces—the requirement to maintain reliability and availability with increased program/erase cycles.

As with most devices, EEPROM and Flash EEPROM are susceptible to defects and failures. One consequence is the occurrence of soft errors caused by the gradual shifting of the threshold level of the memory states. The shifting of the threshold level is partly due to ambient conditions and mostly due to stress from normal operations of the memory device such as erase, program or read. As discussed earlier, a cell's threshold level is typically programmed with a margin from the demarcation levels. When the threshold level is shifted from its programmed level, the reliability of reading the intended memory state may be compromised. These soft errors, in their initial stages, are not severe enough to be readily detected during normal operations of the memory device. However, if the shifting is allowed to continue beyond the error margin allowed by the normal read circuit, the soft errors will eventually develop into hard errors and produce read errors. In that event, the hard errors may be corrected by some sort of error correction scheme such as an error correction code (ECC), and the cells in question may be mapped out. However, if too many hard errors had developed at the same time, the errors may be uncorrectable because they overload the capacity of the error correction scheme used. Thus, the capacity of the memory device may gradually be decimated, and worse still, possible uncorrectable errors can render the memory device unreliable.

The above identified failures are unfamiliar to engineers and scientists working on other semiconductor memories. For example, whereas DRAM may also suffer from failures due to charge leakage, such leakage is predominantly the result of bombardment by alpha particles. Thus, DRAM failures are instantaneous, unpredictable, random and independent of the program/erase circles. On the other hand, EEPROM failures are generally gradual, predictable and depend upon the number of times a memory is erased and programmed. Moreover, whereas DRAM failures are isolated, EEPROM failures are aggregative, as a group of cells may be subjected to repeated memory operations. When failures occur in aggregate, they may overload known error correction schemes.

The different characteristics of the failures between DRAM and EEPROM thus demand prevention techniques that are completely different from those available to DRAM designers.

U.S. patent application Ser. No. 337,566 of Harari et al. discloses a scheme of detecting and handling errors "onthe-fly" by verifying each memory operation, such as read, program or erase, after its has been performed. A verification failure indicates a defective cell, and the address of a defective cell is re-mapped the address of a good one. Similarly U.S. patent application Ser. No. 422,949 of Gross et al., now U.S. Pat. No. 5,200,959, discloses a scheme of detecting and handling errors "on-the-fly."

These error detection schemes are based on detecting errors cell-by-cell, by sensing abnormal read, program or erase operating conditions of the memory devices. However, they are not effective in preventing soft errors which may later deteriorate into catastrophic errors. For example, a small voltage drop caused by a soft error may escape detection by the schemes disclosed in these co-pending applications because it is still within the margin of error allowed by the read, program or erase operations. But a group of cells may continue to deteriorate until they cross the margin of errors together. At that point, remedies may be unavailable.

What is needed is an error correction scheme that is capable of preventing and correcting mass data deteriorations.

Accordingly, it is an object of the invention to provide a Flash EEPROM or EEPROM device with improved reliability.

It is another object of the invention to provide a Flash EEPROM or EEPROM device capable of detecting and correcting potential errors during the lifetime of the device.

It is yet another object of the invention to provide a Flash EEPROM or EEPROM device capable of recovering data from read errors which may not be correctable by available error correction schemes.

SUMMARY OF THE INVENTION

These and additional objects are accomplished by improvements in solid-state memory systems such as EEPROM and Flash EEPROM systems and in techniques that allow simple and effective handling of errors and defects, so that non-volatile, solid-state memory, even if imperfect, may be used reliably and economically as a mass storage.

In an EEPROM cell capable of storing two or more memory states by virtue of its programmed threshold voltage, any two adjacent memory states such as "0" and "1" may be distinguished by whether or not the programmed threshold voltage level is below or above a corresponding pair of demarcation voltage levels. One important aspect of the invention is the continual monitoring and correction of the memory cells' threshold voltage levels, in recognition of their tendency to shift and possibly converge towards the demarcation voltage levels during normal operations of the memory. In other words, the nature of the EEPROM or Flash EEPROM devices is such that the threshold window spanned by the minimum and maximum threshold voltage levels tends to close with use, and the invention provides a dynamic scheme for resisting this trend by resetting the shifted threshold levels to their original intended levels.

Under normal operation, a two-state memory cell, for example, is erased with sufficient margin below a demarcation threshold voltage level to a hard "0" or programmed with sufficient margin above the demarcation voltage level to a hard "1". As the memory device is used, the threshold level of a cell not subjected to erase or program operations may lose margin, thereby producing a soft error not readily detectable by normal operations of the device. The invention provides a scheme for continually "scrubbing" the sectors in the array to maintain all cells within the proper margins. When a sector is scrubbed, its cells are tested to determine if their margins are maintained, and if not, they are rewritten with the proper margins.

An important mechanism for occurrence of soft errors is due to normal operations in one area of the memory device creating perturbations in other areas. The perturbation may cause electric charge to leak either into or out of the floating gate of the perturbed cells, again resulting in a shifting of the programmed threshold voltage levels. If enough of these perturbations accumulate on a cell, a hard error could develop.

In one embodiment, the scrubbing scheme is applied to a memory array that is organized into a plurality of independently erasable and programmable sectors of memory cells, wherein operations such as programming on one or a group of sectors may disturb or shift the threshold levels in cells of other sectors in the array. The invention calls for the "scrubbing" of at least one of the other sectors every time after it has been subjected to a predefined number of potentially disturbing operations. In this way statistically, no sector in the array will likely be exposed to such potential disturbances more than a predetermined number of times, even if it never had occasion to be erased or programmed. This is because it will eventually be visited by the scrubbing treatment which checks the cells of the sector for proper margining and rejuvenate them by re-writing the data with a proper margin if required.

When the disturbing operation is a write operation, the scrubbing operation is applied to a memory array after a predefined number of write operations performed on a portion of that array. Preferably one or more sectors other than ones that have been just written are scrubbed.

When the disturbing operation is a read operation, the scrubbing operation is applied to a memory array after a predefined number of read operations performed on that array. Either the sector that has been read or another randomly chosen sector is scrubbed.

The "scrubbing" technique as prescribed by the invention is a very powerful, yet simple way to improve the reliability and extend the life-expectancy of the EEPROM or Flash EEPROM devices. By "amortizing" the scrubbing operation of the whole array over many normal operations, the memory device suffers very little degradation in performance.

According to another aspect of the invention, a read margining technique is used to recover data in a set of cells where the number of hard errors exceeds the capacity of the available error correction means. This applies to the case where the threshold levels of a number of cells in the set have shifted too close to or beyond the demarcation threshold voltage level that the original states can no longer be read correctly. These hard errors become unrecoverable when their number exceeds that which could be corrected by the error correction code (ECC) implemented for the set. The read margining technique calls for a trial and error process of reading the set of cells in question each time with a repositioned demarcation threshold voltage level displaced about the normal level in both directions until the number of hard errors is reduced sufficiently for ECC to effect recovery of data.

Additional objects, features and advantages of the present invention will be understood from the following description of the preferred embodiments, which description should be taken in conjunction with the accompanying drawings.

BRIEF DESCRIPTION OF THE DRAWINGS

FIG. 3 lists exemplary voltage values for normal operations of the memory devices according to the preferred embodiment.

FIG. 4 is a schematic diagram illustrating the functional blocks of the memory device according to the preferred embodiment.

DETAILED DESCRIPTION OF THE PREFERRED EMBODIMENT

Figure 1A:
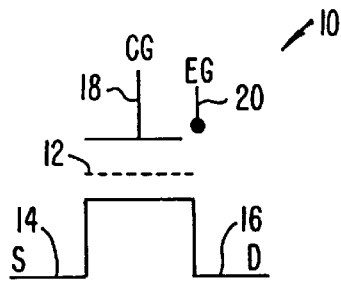
FIG. 1a is a schematic representation of a single EEPROM cell.
Figure 1B:
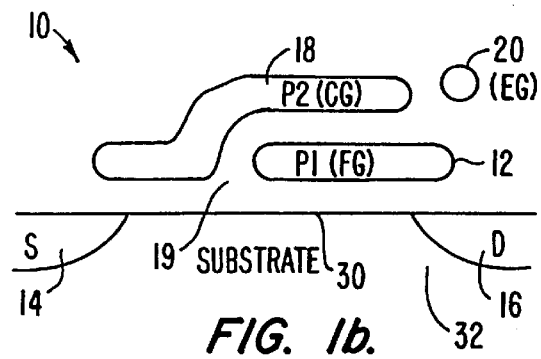
FIG. 1b is a cross-sectional view of an EEPROM device integrated circuit structure.

FIG. 1a illustrates schematically a typical EEPROM cell 10 having a floating gate 12, a source 14, a drain 16, a control gate 18 and an erase gate 20. An exemplary EEPROM structure is generally illustrated in the cross-sectional view of FIG. 1b. The memory cell 10 is formed on a lightly p-doped substrate 30. The source 14 and the drain 16 are formed as two heavily n-doped implanted regions. The floating gate 12, and the control gate 18 are generally made of polysilicon material and insulated from each other and from other conductive elements by regions of dielectric material 19.

The memory cell 10 is programmed by transferring electrons from the substrate 30 to the floating gate 12. In the example cell of FIG. 1b, the electric charge in the floating gate 12 is increased by electrons forced across the dielectric region 19 from the channel 32 near the drain 16 and into the floating gate 12. Electric charge is removed from the floating gate 12 during an erase operation through the dielectric region 19 between it and the erase gate 20. A preferred EEPROM structure, and the process for its manufacture, are described in detail in U.S. patent application Ser. No. 323,779 of Jack H. Yuan and Eliyahou Harari, filed Mar. 15, 1989, now U.S. Pat. No. 5,070,032, which is incorporated herein by reference.

The amount of electric charge stored in the floating gate 12 can be detected by sensing the change of the threshold voltage, which increases with the amount of electric charge on the floating gate 12. Depending on the characteristics of the memory cells and system, a range of threshold voltage levels is possible, defining a threshold window spanned by a maximum and a minimum level. Thus, it is possible to partition the threshold window into two or more portions with demarcation threshold voltage levels and to define two or more memory states. Multi-state EEPROM devices have been disclosed in co-pending U.S. patent application Ser. No. 508,273 of Mehrotra et al., filed Apr. 11, 1990, now U.S. Pat. No. 5,172,338, which is incorporated herein by reference.

For the purpose of discussion and illustration, reference will hereinafter be made to a two-state memory cell. However, it should be understood that generalization to more than two states are equally applicable and contemplated.

As an example, a memory cell may have a threshold window ranging from 1V to 9V. A demarcation threshold voltage level of 5V may be used to demarcate between "0" and "1" states in a two-state memory cell. Generally, a good "0" state may have been erased to a threshold voltage of 3V with adequate margin to spare. Similarly a good "1" state may have been programmed to a threshold voltage of at least 6V.

The detection can be performed by measuring the source-drain current IDS between the source 14 and the drain 16 in the presence of a reference or predefined voltage applied to the control gate 18. If a potential difference is applied between the source 14 and the drain 16 when a 5V is applied to the control gate 18, the drain-source current $I_{DS}$ will be higher when the cell 10 is in the "erased" state than when it is in the "programmed" state.

The various aspects of the present invention are typically applied to an array of flash EEPROM cells in an integrated circuit chip.

Figure 2:
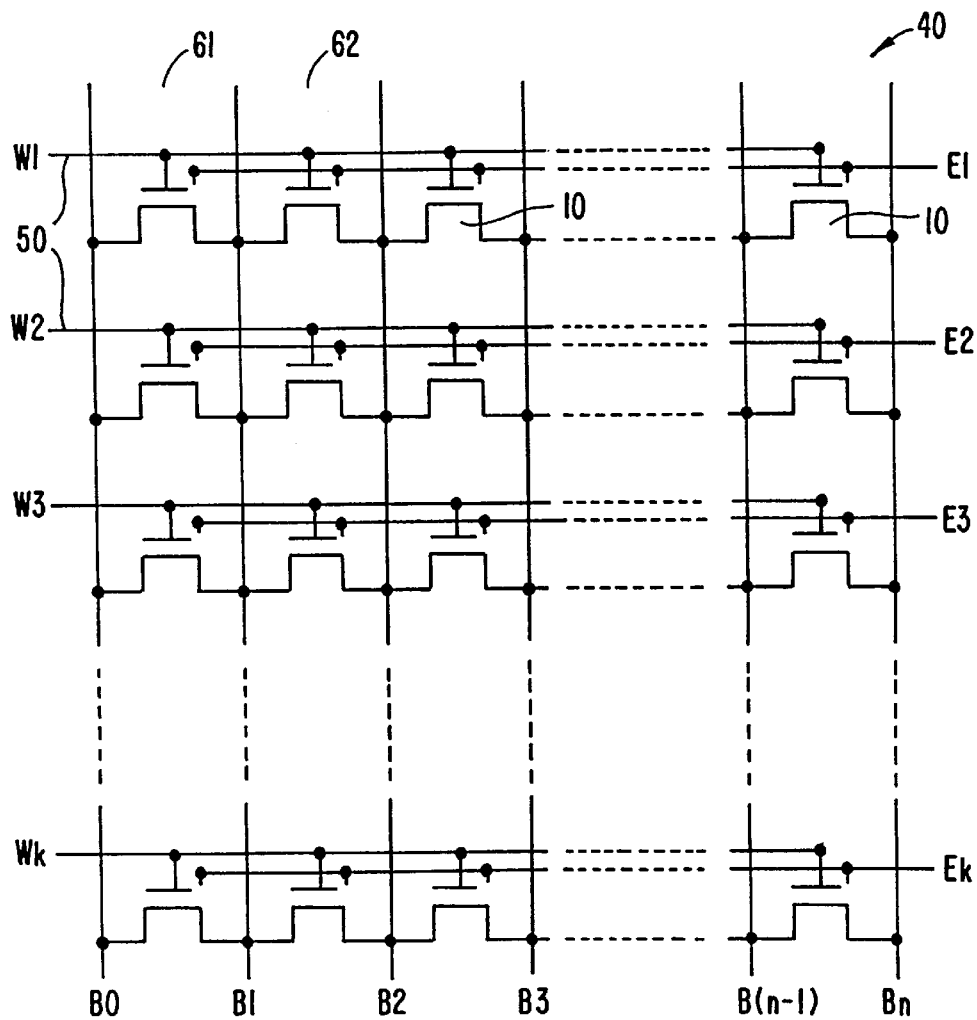
FIG. 2 illustrates a two-dimensional array of EEPROM cells.

FIG. 2 illustrates schematically a two dimensional array of EEPROM cells 201. Each cell 10 has a structure similar to the one shown in FIG. 1a or 1b, with a control gate, a source, a drain and an erase gate. The array of individual memory cells 201 are organized in rows and columns. The control gates of the cells in each row are connected by a word line 50, such as $W_1$, W2. The cells along each column have their sources and drains individually connected to a pair of bit lines, such as $B_0$, $B_1$ for column 61 and $B_1$, $B_2$ for column 62. Each cell is addressable by energizing the word line and the pairs of bit lines to which it is connected.

FIG. 2 illustrates a preferred architecture in which the drain of one cell such as 61 is connected to the source of the adjacent cell. Thus, the column 61 has the bit line $B_0$ as the source line (SL) and the bit line $B_1$ as the drain line (DL). Similarly, for the column 62, the bit line $B_1$ is the source line and the bit line $B_2$ is the drain line.

An erase line, such as $E_1$, $E_2$, is connected to the erase gate of each cell in a row. In flash EEPROM devices, the erase gates of a sector (to be described hereinafter) of several rows of cells are typically connected in common so they can be erased together "in a flash".

As a specific example, a row of cells provides 16×8 bytes, or 128 bytes of data. Extra cells are redundantly provided for re-mapping in case certain cells become defective.

Figure 2B:
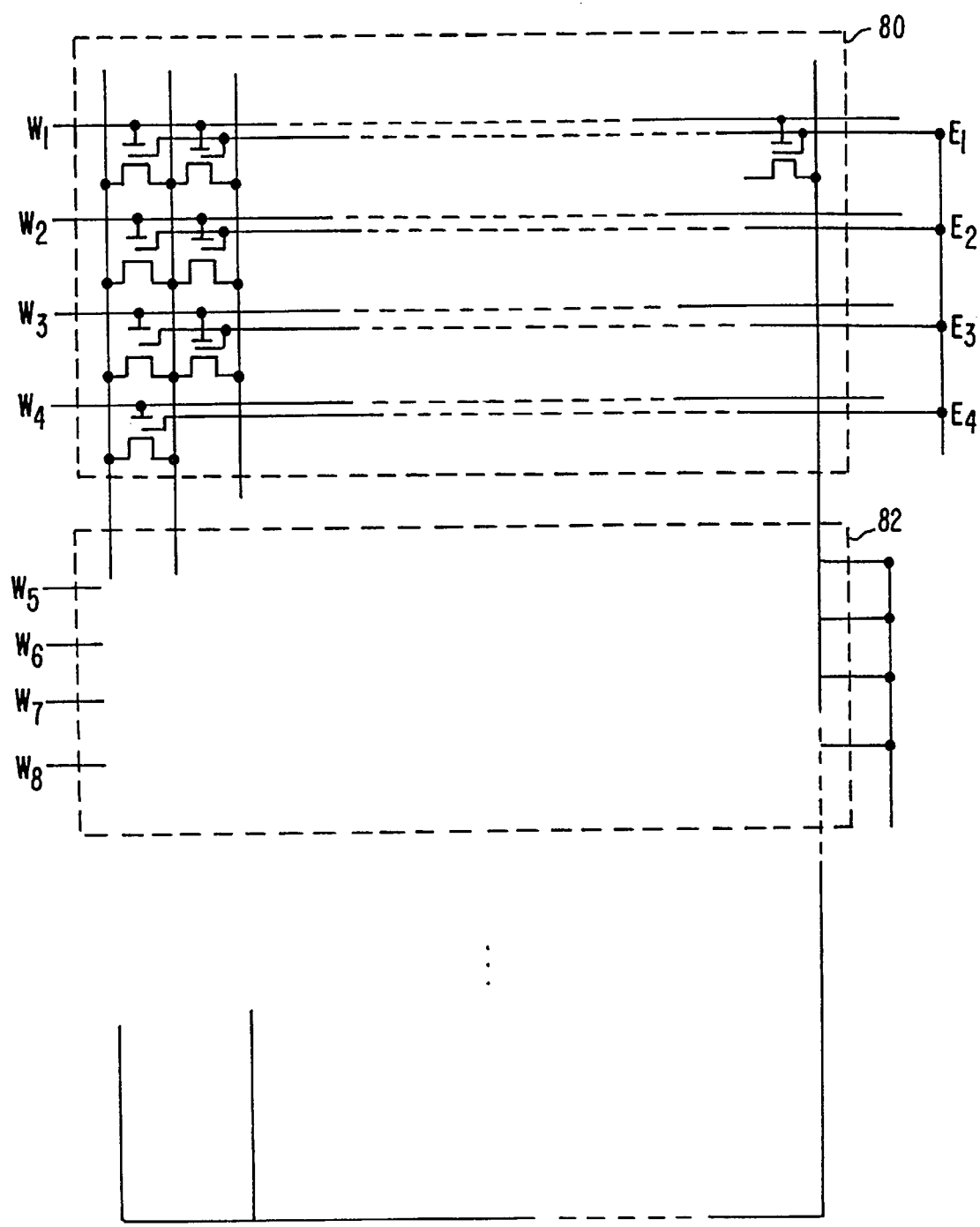
FIG. 2b illustrates the partitioning of an array of memory cells into a plurality of flash sectors in the preferred embodiment.

FIG. 2b illustrates the partitioning of an array of memory cells into a column of flash sectors in the preferred embodiment. In conformity with disk operating systems in which data is programmed or erased in 512 byte sector at a time, each flash sector such as 80, 82, ... is formed by 4 rows of cells, forming 512 bytes of data. For example, the erase gates, such as E1, E2, E3 and E4, of a sector of cells, such as 80, are tied together so that they are erased in a single erase operation as in a typical magnetic disk drive. Typically programming operations are also applied to a sector of cells at a time.

FIG. 3 provides exemplary voltage conditions of a Flash EEPROM system for normal memory operations. In performing a read, program or erase operation, each cell is addressed by selectively applying predefined voltages to its word line, source line and drain line. For, example, in performing a read operation, 5 volt is applied to the word line, along with 0 volt on the source line (SL) and 1.5 volt on the drain line (DL). The bit lines of cells not involved in the read operation are floated. To program a "1" into a cell, 12 volt is applied to its word line, WK, and 0 volt is applied to its source line (SL) and 8 volt is applied to it drain line (DL). The bit lines of cells not involved in the program operation are floated. In performing an erase operation, 20 volt is applied to its erase line.

Program Disturb

In a memory array organized into a column of flash erasable sectors of memory cells, a problem which may be termed "program disturb" can be the mechanism for creating soft errors. The memory array is a two dimensional matrix of memory cells, where each flash sector is formed by one or more rows of cells and the source and drain of each cell down a column is respectively interconnected by a bit line. Thus, the same set of bit lines run through all the column of sectors. To program a cell, a voltage must be applied across its drain and source through the bit lines. At the same time, the cell must also be activated by a voltage to its control gate. For example, the column containing the cell is enabled by having its drain line raised to a high voltage of 8 volt relative to its drain line. The cell to be programmed is addressed by applying 12 volt pulses to its word line. Other cells within the same column are not addressed since their word line is at zero potential; nevertheless they may be affected by the program operation of the addressed cell because of the high voltage on the common drain line. This may induce electric charge leakage in these non-addressed cells, resulting in either a gain or loss of electric charge in their floating gates depending on the electrical mechanism.

In a memory array consisting of a column of independently erasable and programmable sectors, the effect of "program disturb" is to create soft errors by shifting the threshold voltage levels of the cells in other sectors not being programmed. This effect is cumulative, and will eventually result in the soft errors developing into hard errors. It has been estimated that after about $10^6$ to $10^7$ such disturbances, a memory cell may develop a hard error. In a sector, the hard errors that develop and which cause data to be misread may initially be corrected by ECC, but as more of them developed, they may become uncorrectable as the capacity of ECC is exceeded.

In the case of conventional Flash EEPROM, the whole array is flash erased and programmed every cycle. Any area of the array is at most disturbed once before it is re-programmed and consequently "program disturb" is not a major concern.

FIG. 4 is a block diagram of a memory device 141 in which the various aspects of the present invention are implemented. The memory device 141 is essentially similar to that of the co-pending Mehrotra et al., U.S. Pat. No. 5,172,338 which was earlier incorporated herein by reference.

The memory device 141 shown in FIG. 4 comprises the flash EEPROM array device 201 as illustrated in FIG. 2. The memory device 141 receives commands (e.g. read, program, erase) from a memory controller 133, along with the corresponding addresses and data (if any) through an interface 135.

The commands, addresses and data are received by a protocol logic 205 with the memory device 141. The protocol logic 205 decodes a command into control signals 345, including a program signal, a erase signal (E) and a read signal (R). In accordance with the present invention, a "program verify (PV)" signal, a "program read high (PRH)." signal, a program read low (PRL) signal, a "scrub read high (SRH)" signal and a scrub read low (SRL) are generated along with the program signal from the program command. Also in accordance with the present invention an "erase verify (EV)" signal is generated along with a erase signal from an erase command.

In one embodiment, a plurality of voltage sources 245 are received by the memory device 141 from the memory controller. The voltage sources are sent to the power control unit 207. The power control unit 207 also receives the control signals identified in the previous paragraph from the protocol logic 205.

In response to the control signals from the protocol logic 205, appropriate ones 346 of these voltages is output from the power control unit 207 for use in a specific memory operations. These voltages include: read voltage ($V_R$) which is enabled by the read control signal (R), a program verify voltage ($V_{PV}$) which is enabled by the program verify (PV) signal, a program read high voltage ($V_{PRH}$) which is enabled by the program read high (PRH) signal, a program read low voltage ($V_{PRL}$) which is enable by the program read (PRL) signal, a scrub read high voltage ($V_{SRH}$) which is enabled by the scrub read high (SRH) signal, a scrub read low voltage ($V_{SRL}$) which is enabled by the scrub read low (SRL) signal and an erase verify voltage ($V_{EV}$) which is enabled by the erase verify (EV).

Data received from the memory controller 133 for a program operation are gated into a write circuit 211. A buffer is provided within the write circuit 211 for storing the incoming data so that it can be used during the program operation, as well as for verifying that the data have successfully been programmed into the memory array 201, as will be described hereinafter.

The data stored in the memory array 201 are retrieved by a read circuit 213 during a read operation or during one of the verify operations performed after a program operation, as will be described hereinafter. Data read from the memory array 201 are stored in a shift register 219 so that they can be sent out to the memory controller 133.

A compare circuit 217 is provided in the memory device 141. This compare circuit 217 can be used, during a verify operation, for comparing the data sent from the memory controller 133 to be programmed into the memory 201 (which has been stored in the buffer of the write circuit 211) with the data that have actually been stored into the memory array 201 for the program operation.

An erase circuit 215 is provided in the memory device 141. This erase circuit 215 receives a erase signal from the protocol logic 205 and generates the erase voltage to the erase lines of the addressed array of cells in the memory array 141.

Addresses received from the memory controller 133 are decoded into word address signals which are gated into a sector/row tag latch 223 and column address signals which are gated into a column decode 224. During operation of the memory device 141, the sector/row tag latch 223 and the column decode 224 operate to connect the voltages coming out of the power control 207 to the proper word lines and bit lines of the memory array 201.

For example, during a read or program operation, the control gate voltage $V_{CG}$ is connected to the word line of the addressed cell. At the same time, source voltage $V_S$ and drain voltage $V_D$ are individually connected to the source line and drain line of the addressed cell(s). Similarly, in erase operations, the erase voltage $V_{EG}$, is connected to the erase lines of the addressed cell(s).

In read operations and in verify operations following a program operation, the memory state of an addressed cell is read by sensing the conduction current $I_{DS}$ through its source and drain when a predefined $V_{CG}$ is applied to the control gate. The drain current is sensed by sense amplifier in the read circuit 213.

Figure 5:
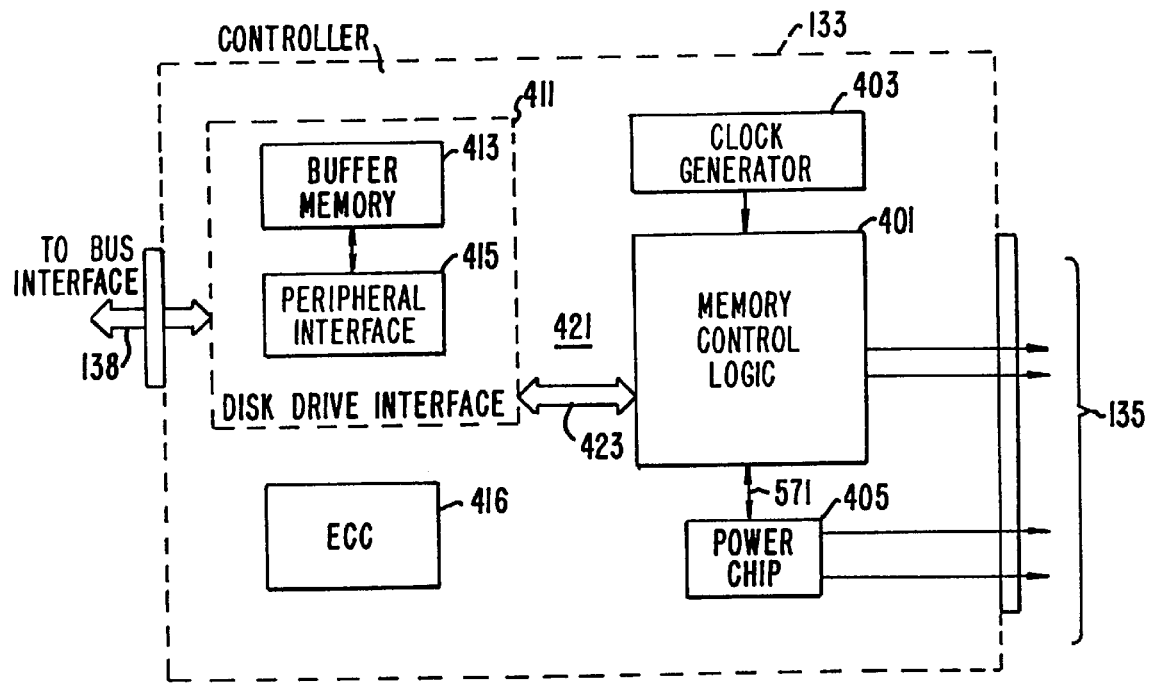
FIG. 5 is a schematic diagram illustrating the functional blocks of a memory controller for controlling a memory device.

FIG. 5 is a schematic illustration of the functional blocks of the memory controller 133. These functional blocks include a peripheral interface 415 providing interface to a host computer system (not shown) and a buffer memory 413 for temporarily storing data to or from the host computer system. An ECC logic 416 is provided for generating error correction codes during a program operation, which will be stored along with the data in the memory device 141 shown in FIG. 4. The ECC logic 416 also operates to check the correctness of the data using these codes during a read operation.

The functions in the memory controller 133 may be implemented either by hardware or by software stored in a memory within a memory control logic 401, to be executed by the logic 401 in appropriate times. In addition to these functions, the controller 133 also has means 405 for providing various voltages required for the operations of the memory device 141.

In one embodiment, all voltages needed by the memory devices 141 for the different operations are generated by the memory controller 133. In another embodiment, only a subset of these voltages are sent to the memory device 141, and other voltages needed for particular operations are generated by the memory device internally, using the voltage received from the memory controller 133.

During a read operation, incoming data from the memory device 141 are stored in the buffer memory 413 within the controller 133. While the data are being received, the ECC logic 416 is activated. The ECC logic 416 operates to calculate an error correction code for the data received. When the data is completely received into the buffer 413, the ECC logic 416 will compare the ECC stored along with the retrieved data against the calculated ECC. If an ECC error is detected, appropriate actions will be taken; and the corrected data will be sent to the host computer system.

Figure 6A:
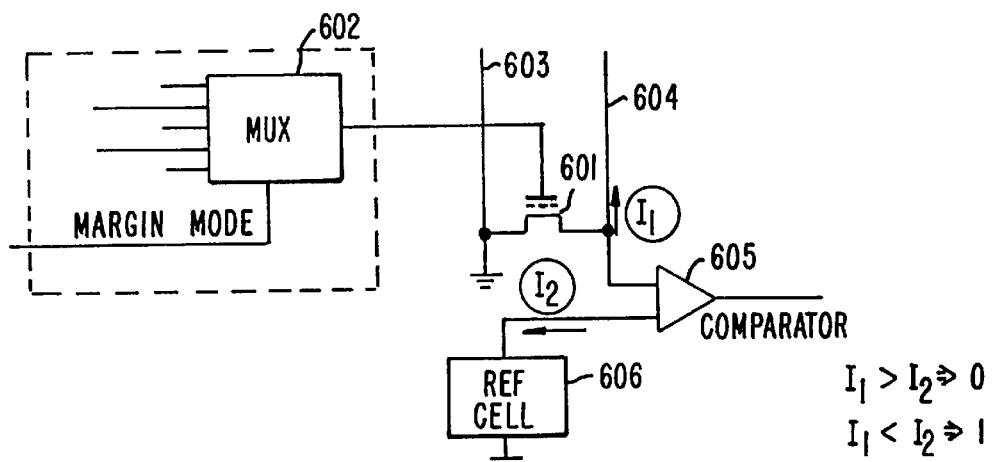
FIG. 6a is a schematic diagram illustrating one implementation of a read circuit for a memory cell.
Figure 6B:
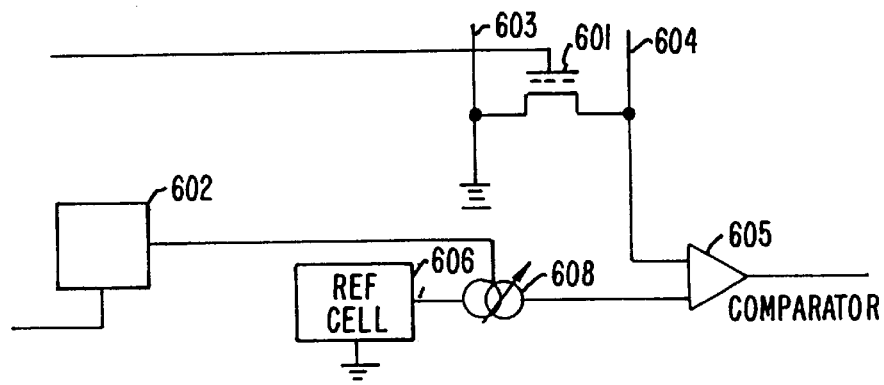
FIG. 6b is a schematic diagram illustrating another implementation of a read circuit for a memory cell.

FIGS. 6a and 6b illustrate schematically how the logic states of a memory cell is sensed.

FIG. 6a illustrates a memory cell 601 whose control gate is connected to the output of a multiplexor 602 which can be considered as part of the power controller unit 207 shown in FIG. 4. The multiplexor 602 receives at its inputs the several voltage sources 245 and the several control signals 345 described hereinabove in reference to FIG. 4.

As previously disclosed, the source terminal of the memory cell 601 is connected to a source bit line 603 and the drain terminal is connected to a drain bit line 604. The drain bit line 604 is also connected to one input of a comparator 605. The other input of the comparator 605 is connected to the output of a reference cell 606. The function of the reference cell 606 is described in the co-pending application Ser. No. 508,273 of Mehrotra et al., incorporated herein by reference earlier.

The reference cell 606 generates a reference current $I_{REF}$ to the comparator 605 for comparing the source current from the memory cell 601. In reading the memory cell 601, the drain bit line 604 will be pre-charged to provide 1.5 volts across the source and drain of the memory cell 601.

Depending upon the operations to be performed, different voltages are applied to the control gate of the memory cell 601. However, the drain-source current $I_{DS}$ will be higher when the cell 601 is in the "erased" state than when it is in the "programmed" state. The $I_{REF}$ is set at a point between the two levels of $I_{DS}$. Thus, when the cell 601 is "0" or "erased", a first voltage signal will be output from the comparator 605 because $I_{DS}$ is greater than $I_{REF}$. And when the cell 601 is "1", a second, different voltage signal will be output from the comparator 605 because $I_{DS}$ is smaller than $I_{REF}$.

In accordance with this invention, different voltages are applied to the control gate for different operations. For example, for a normal read operation, $V_R$ (which is 5 volt in the preferred embodiment), is applied. After the memory cell 601 has been programmed, a program verify operation is performed to read the content of the memory cell just programmed. However the voltage $V_{PV}$ for this operation is different from the voltage used in a normal read operation.

Program "1" Verify Margining

For example, the voltage used in the program verify operation may be higher than the voltage used during a normal read operation. As the negative electric charge in the floating gate operates to oppose the voltage at the control gate, if sufficient negative electric charges are forced into the floating gate so that even a higher voltage can still be opposed, sufficient additional margin can therefore be considered to have been provided in the program operation. By using a more stringent condition in the verify operation than in the normal read operation, reliability of the memory is improved.

Erase "0" Verify Margining

Similar verification is performed after an erase operation. This verify operation is performed to ensure that a cell has indeed been erased to "0" with sufficient additional margin for improved reliability. The voltage used for this verifying operation is again more stringent, this time, with a control gate voltage less than the voltage value used in a normal read operation.

Read "0" and "1" Margining

To further improve the reliability of the memory system, in addition to the erase and program verify operations, a read margining operation is performed on the sector of cells after it has been written to verify both "0" and "1".

The read margining operation reads the cells to verify that all "1" and all "0" data have indeed been written into the sector of memory cells 601 with sufficient margin to pass when they are read with control gate voltages more stringent than the voltage used in a normal read operation.

Automatic Soft Error Detection and Correction (Scrubbing)

As explained earlier, the column of sectors in the memory array share the same bit lines and consequently programming of one sector may disturb the other sectors within the array. To still further improve the reliability of the memory system against such disturbance, after a predetermined number of program operations on a selected set of sectors, a scrub operation will in general be performed on a different set of sectors in the memory array. The scrub operation uses a control gate voltage that is again different than the control gate voltage used in a normal read operation to insure sufficient extra margin, thereby providing failure look-ahead. The scrub operation assures that the program operation on the selected set of sectors has not adversely affected other sectors of the memory. If a sector fails this scrub margin check, the data within the sector is rewritten back to that sector with full write margin levels, with the option of mapping failed bits.

In the preferred embodiment, the scrub operation would read one sector of cells if less than eight sectors are programmed in a program operation. If more than eight sectors but less than sixteen sectors are programmed, two sectors of cells would be read in the scrub operation. In general, for each eight sectors of cells programmed, one additional sector would be subjected to the scrub operation.

FIG. 6b illustrates another implementation of the present invention. Instead of applying at the control gate voltages with different values from the normal read operation, the same voltage can used for the different verify operations and the scrub operation. However, the reference current, $I_{REF}$, will be changed during the different operation. As shown in FIG. 6b, a adjustable current source 608 is connected in series with the reference cell 606. The output current from the adjustable current source 608 is adjusted by the different control signals. For example, according to the preferred embodiment, in performing a program verify operation (in which the "1"s are tested), the adjustable current source 608 would output a current which combines with the current from the reference cell to form a current smaller than the reference current for a normal read operation. In this way, the current produced by the cell 601 would have to have a tolerance from its normal value. As another example, in performing an erase verifying operation (in which the "0" are tested), the adjustable current source 608 would output a current which combines with the current from the reference cell to form a current larger than the reference current for a normal read operation.

Figure 7:
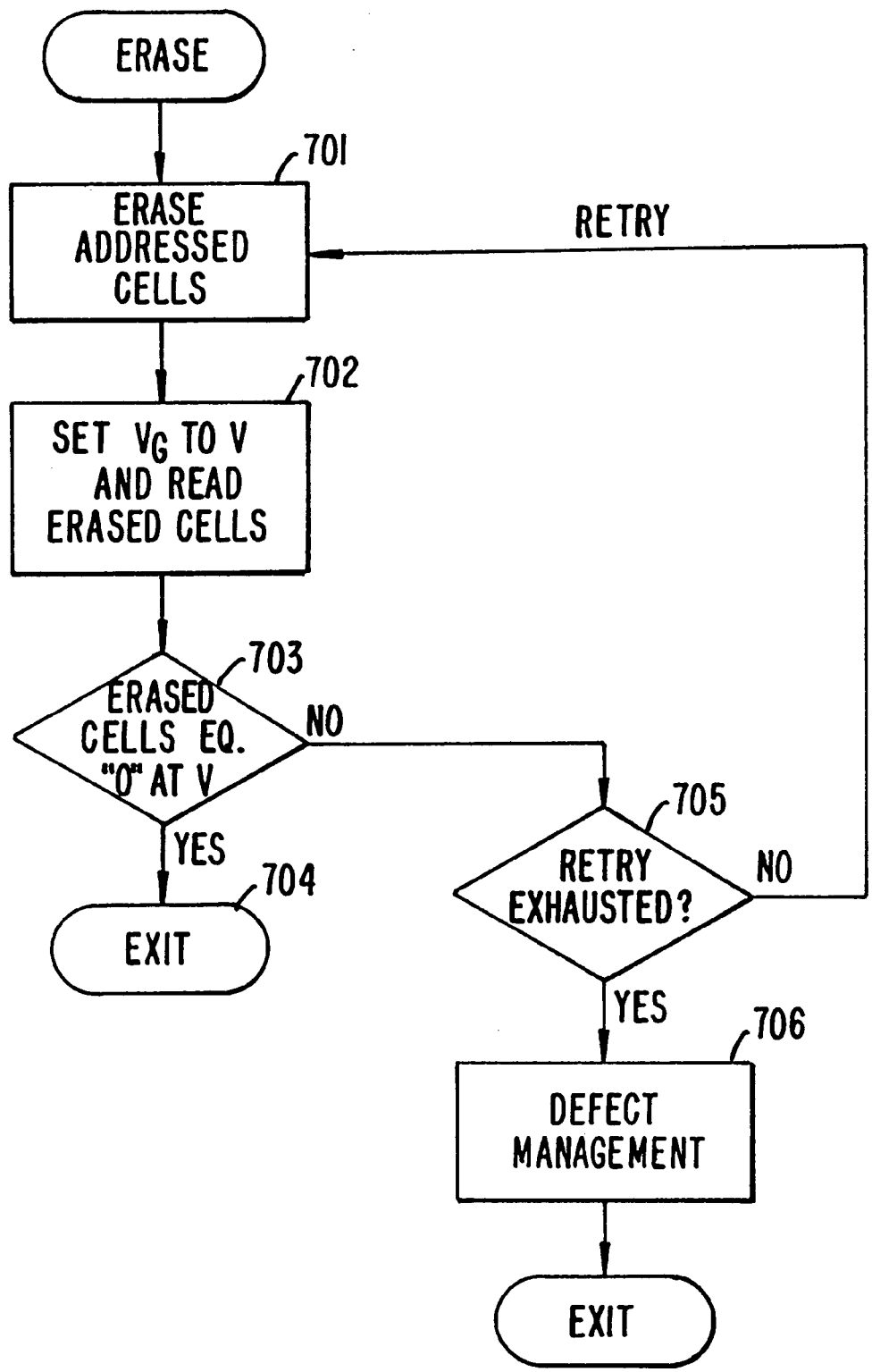
FIG. 7 is a flow chart illustrating generally the steps of an erase operation according to the preferred embodiment.

FIG. 7 is flow chart illustrating in general the procedure in the preferred embodiments for performing an erase operation.

In step 701, the addressed cells are erased, by applying a pulse of voltage $V_E$ to their erase gates, as disclosed in co-pending U.S. patent application Ser. No. 670,246 filed Mar. 15, 1991 by Harari et al., now U.S. Pat. No. 5,270,979.

After the erase operation, an erase verify operation is performed in step 702. In this erase verify operation 702, a voltage $V_{EV}$ is applied to the control gates of the cells while the data is read. If, in step 703, all the erased cells are indeed "0" even with $V_{EV}$ as the control gate voltage, the erase operation is considered to be successful and the operation terminates at step 704. Otherwise the erase operation will be retried in step 701, unless enough number of retries have already been performed, as determined in step 705, in which case the memory cells will be considered unsalvageable and a defect management step will be performed in step 706. In the defect management step, the failing memory cells may, for example, be mapped out, and the logical addresses of those cells re-mapped into a set of redundant cells. Defect management has been variously disclosed in co-pending U.S. patent application Ser. No. 337,566 of Harari et al., U.S. patent application, Ser. No. 422,949 of Gross et al. and co-pending U.S. patent application Ser. No. 670,246 of Harari et al., all of which have earlier been incorporated herein by reference.

Figure 8:
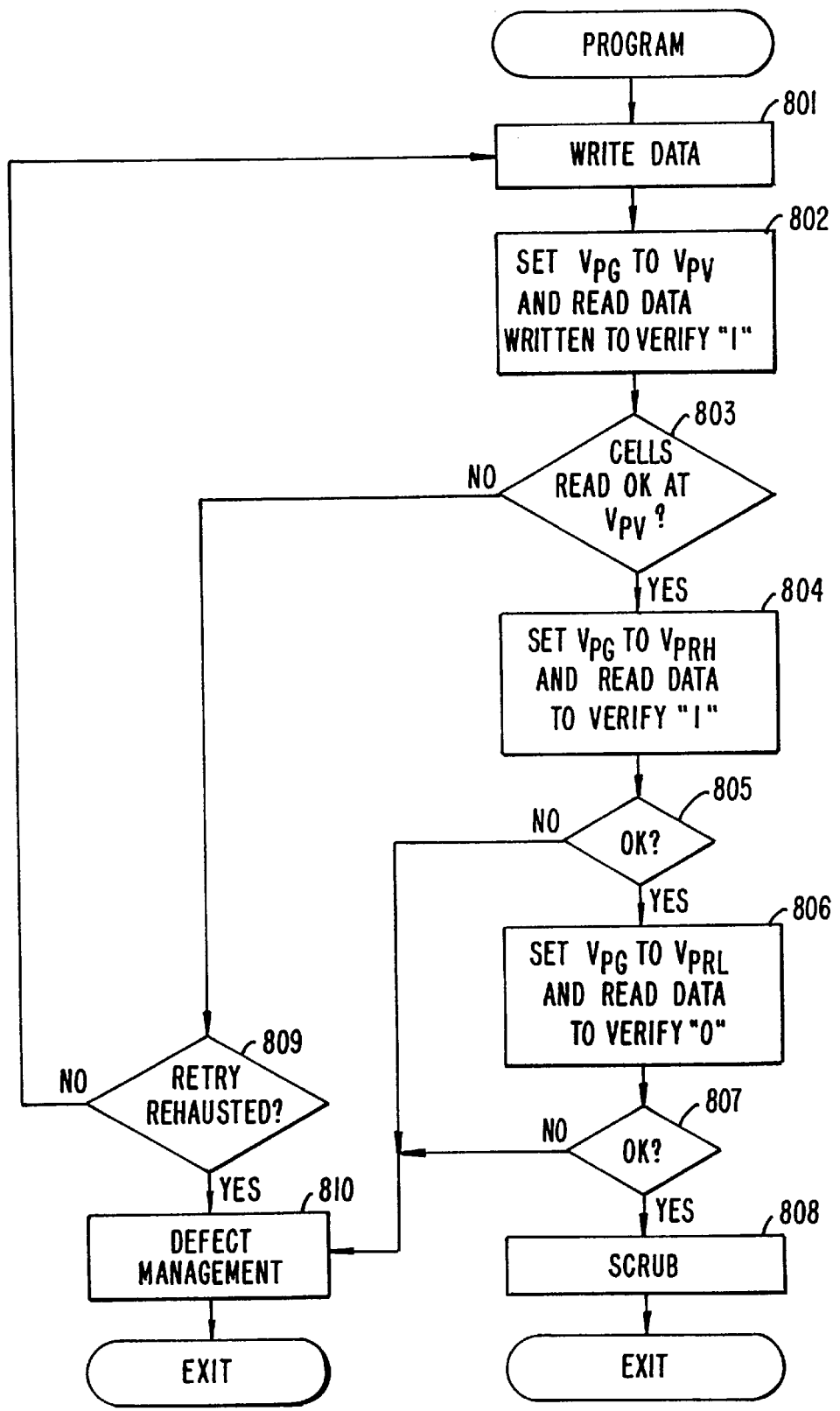
FIG. 8 is a flow chart illustrating generally the steps of a programming operation according to the preferred embodiment.

FIG. 8 is a flow chart illustrating the procedure in the preferred embodiment for performing a program operation. The program operation applies to previously erased sectors.

In step 801, the memory cells are programmed. As previously described, for cells which are to be programmed with a "1", a 12 volt pulse is applied to their word lines and 0 volt is applied to the source line and 8 volt is applied to the drain line.

Upon termination of the programming step 801, a program verify operation 802 is initiated. In the program verify operation 802, the cells are read with a voltage $V_{PV}$ applied to their control gates. A check is then performed to see if all the cells are written correctly under such control gate voltage.

The check can be performed within the memory device 141 (see FIG. 4) using the data stored in the buffer of the write circuit 211. The check can also be performed in the memory controller 133 utilizing the ECC logic 416 (see FIG. 5) by having the controller 133 read the data.

If the data are read correctly, as shown in step 803, even with $V_{PV}$ applied at the control gate, a program verify 802 operation is considered to have performed successfully. (In the preferred embodiment, $V_{PV}$ is higher then the voltage value for a normal read operation, and therefore only "1"'s are actually tolerance-tested.) If, on the other hand, the program verify operation 802 fails, step 803 will cause the program operation to be retried, unless enough retry operations (as determined in step 809) have been performed. In that case, the cell is deemed unprogrammable and defective, and a defection management (step 810) similar to step 706 of FIG. 7 will be performed.

In steps 804–807, a read margining operation is performed on the memory cells. The read margining operation are subdivided into two sub-operations 804 and 806. In the first sub-operations, the control gate voltage is set to $V_{PRH}$ (which, in the preferred embodiment, is higher than the voltage value for a normal read operation) and the data is read and compared with the actual data (as described above). This sub-operation is performed to re-verify that all "1"'s are programmed properly. In the second sub-operation, a voltage $V_{PRL}$, lower than the normal read voltage is used. This sub-operation is performed to re-verify that all "0"s are performed correctly. This is done to insure that no disturbs occurred to previously written bits within a sector while writing subsequent bits within that sector.

In the preferred embodiment, if one of the two sub-operations fails (steps 805 and 807), the defect management operation will be performed.

To further improve reliability of the memory system, a scrub operation is performed in step 808 after a write operation.

Figure 9:
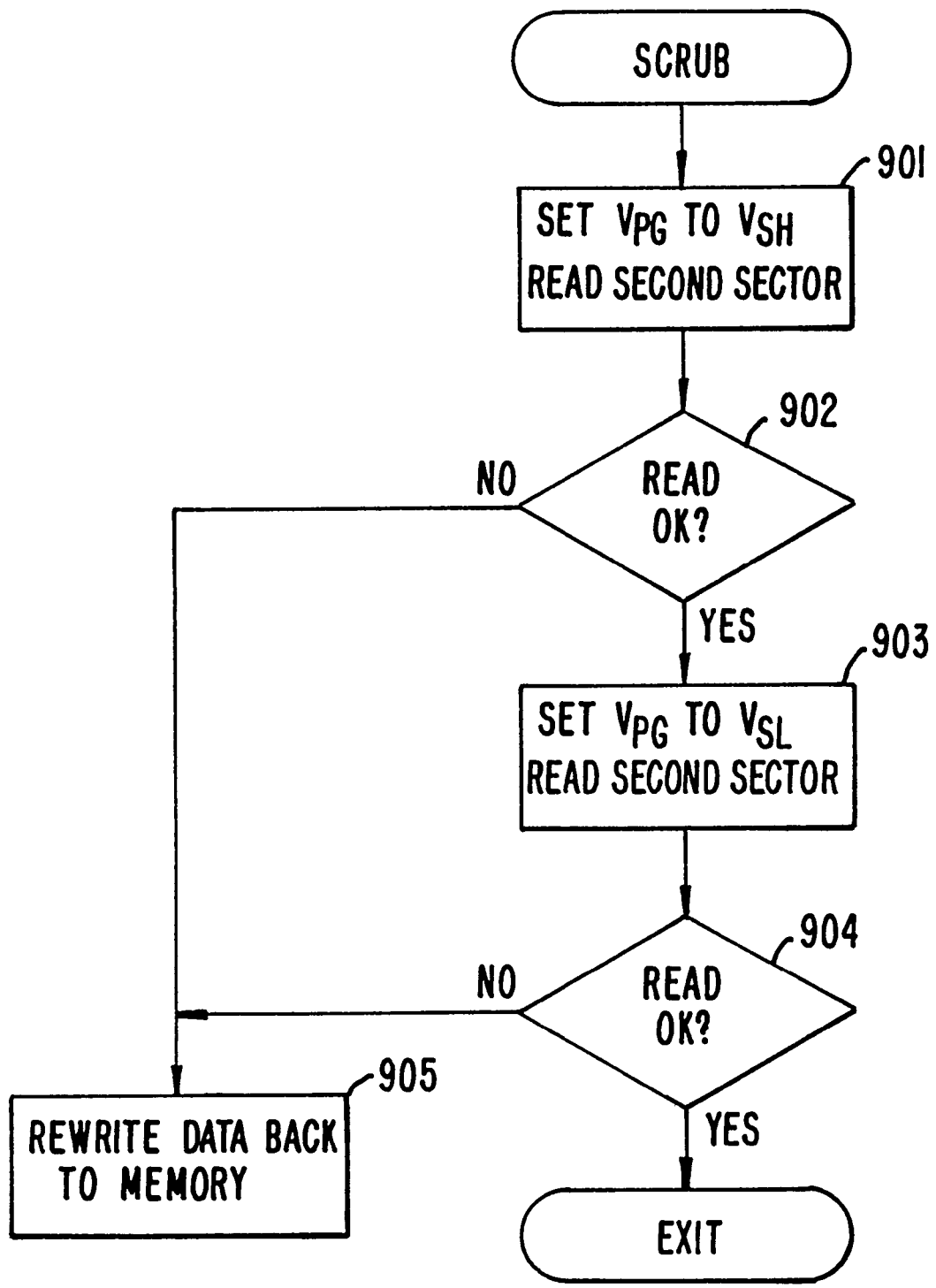
FIG. 9 is a flow chart illustrating generally the steps of a scrub operation according to the preferred embodiment.

FIG. 9 is a flow chart illustrating generally the steps of a scrub operation.

In a scrub operation, generally a different sector of cells sharing common bit lines as the sector of cells involved in a program operation, are tested. The sector to be tested may be chosen randomly. In step 901, a control gate voltage $V_{SH}$, which is higher than the voltage for a normal read operation, is applied. The cells are read in step 902 to see if there is any error as determined by the ECC check. Steps 901 and 902 are performed to verify that the "1"s in the chosen sector of cells are unaffected by the program operation.

In step 903, the scrub operation is performed again on that chosen sector, with a control gate voltage $V_{SL}$ lower than that for a normal read operation. The cells are read in step 904 to see if there is any error as determined by the ECC check. Steps 903 and 904 are performed to verify that the "0"s in the chosen sector of cells are unaffected by the program operation.

In the scrub operation, since the actual data does not reside in the buffer of the write circuit 211 of FIG. 4, the test can be performed in the memory controller 133 utilizing the ECC logic 416 of FIG. 5. If the data in the sector(s) to be scrubbed can be read without ECC errors, they are left alone and the program operation is considered to have been completed successfully.

If the scrub operation for the sector(s) being scrubbed fails, then a rewrite operation 905 will be performed thereon to reprogram the sector(s). The steps of this program operation follows the procedure set forth in FIG. 8.

Figures 10, 11:
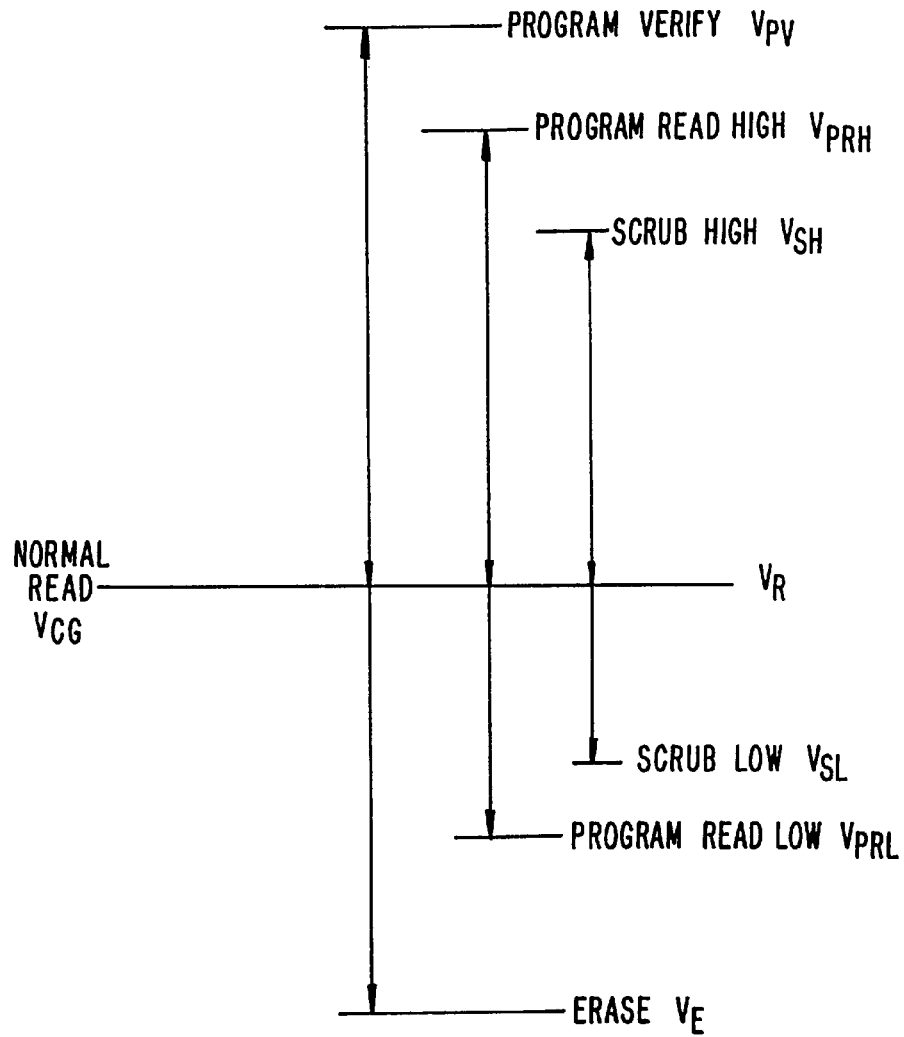
FIG. 10 depicts exemplary relative margining voltage levels for performing the different operations according to the preferred embodiment.
FIG. 11 lists exemplary values of margining voltage levels for performing the different operations according to the preferred embodiment.

The relative levels of the different voltages used for different operations in the preferred embodiment are illustrated in FIG. 10. Example voltage values of these levels are listed in FIG. 11.

Additionally, a scrub during read implementation of the present invention, analogous to the scrub during write provides still further reliability improvement. In this embodiment, a read under margin to either the selected sector to be read, or another sector, which may be chosen randomly, is performed periodically, for example following every 1000 reads as well as at initial power up. If the sector passes the scrub margin reads, no action is taken, while if it fails, the data is corrected and rewritten. This provides failure look-ahead, prior to failing read under the normal operation, adding additional reliability to the memory.

Data Recovery Using Margining

The ability to provide different control gate voltages in conjunction with ECC implementation is advantageously used in the preferred embodiment to further increase the endurance and reliability of the memory system.

If during a normal read operation, an uncorrectable ECC error is detected, under memory systems heretofore known, the data would be considered unusable. In accordance with the present invention, the control gate voltage can be adjusted either upward or downward in small steps about the normal voltage and the data is re-read. If, at a particular adjusted voltage, the ECC error disappears or becomes correctable, the corresponding data can then be recovered. The recovered data is then written back into the cells so that it can be read in future using normal operating conditions.

While the embodiments of this invention that have been described are the preferred implementations, those skilled in the art will understand that variations thereof may also be possible. Therefore, the invention is entitled to protection within the full scope of the appended claims.

We claim:

1. A solid-state memory comprising:
   an array of memory cells, the memory cells of said array being individually capable of having a threshold voltage programmed or erased to an intended level within a range supported by the memory system;
   monitoring means invoked at least one of a plurality of predefined events of the memory system for identifying one or more cells each having a threshold voltage shifted beyond a predetermined margin from its intended level;
   writing means for re-writing said shifted threshold voltage back to its intended level;
   wherein said plurality of predefined events of the memory system include memory operations on a portion of the memory array that are liable to perturb cells within said portion of the memory array; and
   wherein the memory cells are individually programmable into more than two states in order to store more than one bit of data per cell.

2. A solid-state memory as in claim 1, wherein said memory operations include programming operations.

3. A solid-state memory as in claim 1, wherein said memory operations include programming and erasing operations.

4. A solid-state memory as in claim 1, wherein said memory operations include read operations.

5. A solid-state memory as in claim 1, wherein said monitoring means samples one of a plurality of fractions of the memory array outside of said portion, such that statistically substantially all said plurality of factions of the memory array get monitored after at most a predetermined number of said sampling.

6. A solid-state memory as in claim 5, wherein said predetermined number of said sampling is greater than two.

7. A solid-state memory comprising:
   an array of memory cells, the cells of said array being individually capable of having a threshold voltage programmed or erased to an intended level within a range supported by the memory system;
   monitoring means invoked at least one of a plurality of predefined events of the memory system for identifying one or more cells each having a threshold voltage shifted beyond a predetermined margin from its intended level; and
   writing means for re-writing said shifted threshold voltage back to its intended level; and wherein:
      said memory array is partitioned into a plurality of sectors, each sector having cells that are all at a time subjected to one of said specific regular memory operations;
      said monitoring means samples a predetermined number of sectors during each invocation, such that statistically each sector in the memory array gets monitored after at most a predetermined number of said plurality of predefined events; and
      the memory cells of said array are individually programmable into more than two states in order to store more than one bit of data per cell.

8. A solid-state memory system as in claim 7, wherein said plurality of predefined events of the memory system are memory operations on a portion of the memory array that are liable to perturb cells in other portions of the memory array.

9. A solid-state memory system as in claim 8, wherein said memory operations include programming operations.

10. A solid-state memory system as in claim 8, wherein said memory operations include programming and erasing operations.

11. A solid-state memory system as in claim 8, wherein said memory operations include read operations.

12. A solid-state memory system as in claim 7, wherein said plurality of predefined events of the memory system are memory operations on a portion of the memory array that are liable to perturb cells within said portion of the memory array.

13. A solid-state memory system as in claim 12, wherein said memory operations include read operations.

14. In a solid-state memory system including an array of memory cells, the cells of said array capable of having a threshold voltage programmed or erased to an intended level within a range supported by the memory system, wherein soft errors may arise from cells with a shifted threshold voltage, a method for detecting and correcting soft errors comprising the steps of:
   providing a plurality of programmed states in excess of two for the individual cells of said array, whereby the cells individually store more than one bit of data;
   monitoring at least one of a plurality of predefined events of the memory system to identify one or more cells each having a threshold voltage shifted beyond a predetermined margin from its intended level; and
   re-writing said shifted threshold voltage back to its intended level;

wherein said plurality of predefined events of the memory system are memory operations on a portion of the memory array that are liable to perturb cells within said portion of the memory array.

15. A method for detecting and correcting soft errors in a solid-state memory system as in claim 14, wherein said memory operations include read operations.

16. In a solid-state memory system including an array of memory cells, the cells of said array capable of having a threshold voltage programmed or erased to an intended level within a range supported by the memory system, wherein soft errors may arise from cells with a shifted threshold voltage, a method for detecting and correcting soft errors comprising the steps of:

provided a plurality of programmed states in excess of two for the individual cells of said array, whereby the cells individually store more than one bit of data;

monitoring at least one of a plurality of predefined events of the memory system to identify one or more cells each having a threshold voltage shifted beyond a predetermined margin from its intended level; and re-writing said shifted threshold voltage back to its intended level; wherein:

said memory array is partitioned into a plurality of sectors, each sectors having cells that are all at a time subjected to one of said specific regular memory operations; and said monitoring means samples a predetermined number of sectors during each invocation, such that statistically each sector in the memory array gets monitored after at most a predetermined number of said plurality of predefined events.

17. A method for detecting and correcting soft errors in solid-state memory system as in claim 16, wherein said plurality of predefined events of the memory system are memory operations on a portion of the memory array that are liable to perturb cells in other portions of the memory array.

18. A method for detecting and correcting soft errors in solid-state memory system as in claim 17, wherein said memory operations include programming operations.

19. A method for detecting and correcting soft errors in solid-state memory system as in claim 17, wherein said memory operations include programming and erasing operations.

20. A method for detecting and correcting soft errors in a solid-state memory system as in claim 17, wherein said memory operations include read operations.

21. A method for detecting and correcting soft errors in a solid-state memory system as in claim 16, wherein said plurality of predefined events of the memory system are memory operations on a portion of the memory array that are liable to perturb cells within said portion of the memory array.

22. A method for detecting and correcting soft errors in a solid-state memory system as in claim 21, wherein said memory operations include read operations.

23. A solid-state memory system comprising:

an array of memory cells that are individually capable of having a threshold voltage programmed or erased to an intended level within a range supported by the memory system;

monitoring means invoked by at least one of a plurality of predefined events of the memory system for identifying one or more cells that individually have a threshold voltage shifted beyond a predetermined margin from said intended level; and writing means for re-writing said shifted threshold voltage back to said intended level;

wherein:

said plurality of predefined events of the memory system include memory operations on a portion of the memory array that are liable to perturb cells of the memory array outside of said portion;

said monitoring means includes identification by error correction code of said one or more cells that individually have said shifted threshold voltage; and the memory cells are individually programmable into more than two states in order to store more than one bit of data per cell.

24. A solid-state memory system as in claim 23, wherein said portion of the memory array includes a sector of cells that are all erasable as a group.

25. In a solid-state memory system including an array of memory cells that are individually capable of having a threshold voltage programmed or erased to an intended level within a range supported by the memory system, wherein soft errors may arise from cells with a shifted threshold voltage, a method for detecting and correcting soft errors comprising:

providing a plurality of programmed states in excess of two for the individual cells of said array, whereby the cells individually store more than one bit of data;

monitoring at least one of a plurality of predefined events of the memory system to identify one or more cells that individually have a threshold voltage shifted beyond a predetermined margin from said intended level; and re-writing said shifted threshold voltage back to said intended level;

wherein said predefined events of the memory system include memory operations on a portion of the memory array that are liable to perturb cells in other portions of the memory array outside of said portion; and wherein said monitoring includes identifying by error correction code said one or more cells that individually have said shifted threshold voltage.

26. A method for detecting and correcting soft errors in a solid-state memory system as in claim 25, wherein said portion of the memory array includes a sector of cells that are all erasable as a group.

* * * * *

UNITED STATES PATENT AND TRADEMARK OFFICE
CERTIFICATE OF CORRECTION

PATENT NO. : 6,049,899
DATED : April 11, 2000
INVENTOR(S) : Daniel L. Auclair et al.

It is certified that error appears in the above-identified patent and that said Letters Patent is hereby corrected as shown below:

<u>Title page,</u>
Replace "[73] Assignee: Zilog, Inc., Cambell, Calif." with -- [73] Assignee: SanDisk Corporation, Sunnyvale, Calif.--

Signed and Sealed this

Thirteenth Day of November, 2001

Attest:

*Nicholas P. Godici*

NICHOLAS P. GODICI
*Acting Director of the United States Patent and Trademark Office*

*Attesting Officer*